(12) United States Patent
Wyatt et al.

(10) Patent No.: US 10,701,799 B2
(45) Date of Patent: Jun. 30, 2020

(54) PRINTED CIRCUIT BOARD

(71) Applicant: Hewlett-Packard Development Company, L.P., Houston, TX (US)

(72) Inventors: Stewart R. Wyatt, Boise, ID (US); Don E. Saunders, Boise, ID (US); Scott David Hahn, Boise, ID (US); Cameron L. Hutchings, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 15/546,617

(22) PCT Filed: Mar. 31, 2015

(86) PCT No.: PCT/US2015/023701
§ 371 (c)(1),
(2) Date: Jul. 26, 2017

(87) PCT Pub. No.: WO2016/159994
PCT Pub. Date: Oct. 6, 2016

(65) Prior Publication Data
US 2018/0027650 A1 Jan. 25, 2018

(51) Int. Cl.
*H05K 1/02* (2006.01)
*G06F 3/042* (2006.01)
(Continued)

(52) U.S. Cl.
CPC ......... *H05K 1/0274* (2013.01); *G06F 3/0421* (2013.01); *H05K 1/0271* (2013.01);
(Continued)

(58) Field of Classification Search
CPC .............. G06F 3/0421; G06F 3/0412; G06F 2203/04103; H05K 3/46; H05K 3/28;
(Continued)

(56) References Cited

U.S. PATENT DOCUMENTS 4,554,615 A 11/1985 Clark
5,175,047 A * 12/1992 McKenney .......... H05K 3/4691
174/250

(Continued)

FOREIGN PATENT DOCUMENTS

CN 102768588 11/2012

OTHER PUBLICATIONS

Primavera, Anthony, "The Influence of PCB Parameters on CSP Assembly and Reliability", Solid State Technology Insights for Electronics Manufacturing. 2015. Extension Media, 16 pages.

*Primary Examiner* — Jimmy H Nguyen
(74) *Attorney, Agent, or Firm* — HP Inc. Patent Department

(57) ABSTRACT

According to an example, a device may comprise a printed circuit board. The printed circuit board may further comprise a first layer and a second layer. The first layer may comprise a first material and the second layer may comprise a second material. In some examples, the first layer may further comprise at least one mounting hole surrounded by a third material at a thickness equal to a thickness of the first layer, and the first material may be electrically isolated from the third material. In some examples, the printed circuit board may be mated to a light guide assembly for a touchscreen system.

13 Claims, 5 Drawing Sheets

(51) Int. Cl.
*H05K 1/03* (2006.01)
*H05K 1/09* (2006.01)
*H05K 3/46* (2006.01)

(52) U.S. Cl.
CPC ............ *H05K 1/0306* (2013.01); *H05K 1/09* (2013.01); *H05K 3/46* (2013.01); *G06F 2203/04103* (2013.01); *H05K 2201/09063* (2013.01); *H05K 2201/09136* (2013.01); *H05K 2201/09145* (2013.01); *H05K 2201/09781* (2013.01)

(58) Field of Classification Search
CPC ...... H05K 1/09; H05K 1/0271; H05K 1/0306; H05K 1/0274; H05K 1/0215; H05K 1/116; H05K 2201/09063; H05K 2201/09136; H05K 2201/09781; H05K 2201/09145; H05K 2201/0367; H05K 2201/0949; H05K 2201/09618; H05K 2201/10409

USPC ............................ 345/173–175, 102; 349/58
See application file for complete search history.

(56) References Cited

U.S. PATENT DOCUMENTS

| | | |
|---|---|---|
| 5,585,157 A | 12/1996 | Taguchi |
| 6,315,605 B1 | 11/2001 | Billman et al. |
| 8,659,578 B2 | 2/2014 | Yu et al. |
| 8,897,002 B2 | 11/2014 | Degner et al. |
| 2010/0309632 A1 | 12/2010 | Chen |
| 2012/0182497 A1* | 7/2012 | Qi ................... G02B 6/0021 349/62 |
| 2012/0261180 A1 | 10/2012 | Fu |
| 2012/0280936 A1 | 11/2012 | Wang et al. |
| 2013/0153272 A1 | 6/2013 | Chiu et al. |
| 2013/0215614 A1 | 8/2013 | Gulden |
| 2014/0147123 A1 | 5/2014 | Xiao et al. |

* cited by examiner

PRINTED CIRCUIT BOARD

BACKGROUND

Computing systems and electronic devices in general may be sold or configured with one or more varieties of printed circuit boards. Printed circuit boards may be relatively thin, layered substrates upon which integrated circuits and other electronic components may be mounted to form, for example, a printed circuit assembly. In some examples, a printed circuit board or assembly may be paired, mated, or otherwise operable with an input sensor, such as a touchscreen for receiving input from, for example, a fingertip or stylus.

DETAILED DESCRIPTION

Figure 1:
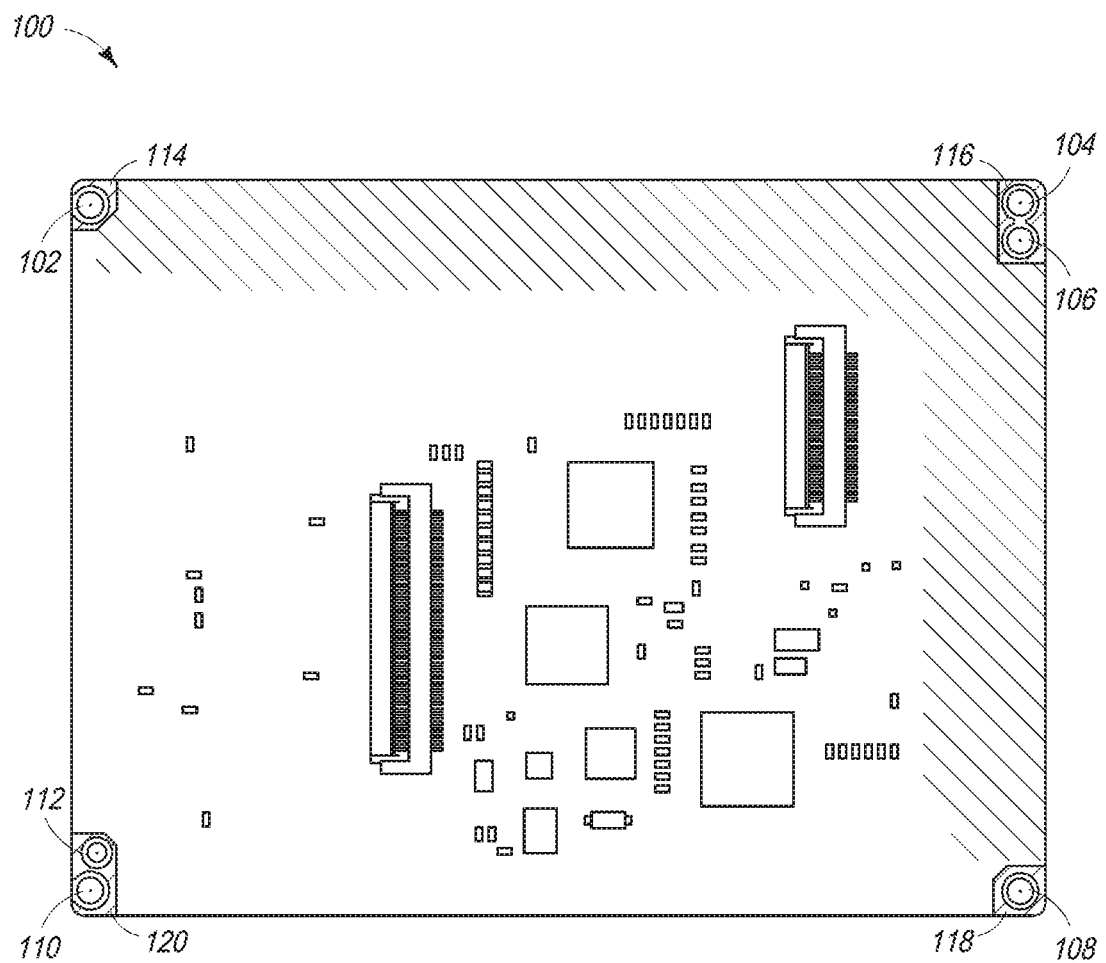
FIG. 1 illustrates a printed circuit board, according to an example of the present disclosure.

Various examples described below relate to a printed circuit board ("PCB") comprising a plurality of layers. The various layers of the PCB may be, for example, copper and/or fiberglass. In some examples, the copper layers may comprise a mounting hole and/or alignment pin to receive a touchscreen light guide, and the mounting hole and/or alignment pin may be surrounded by copper to prevent bowing of a PCB or light guide when mated with each other or another component or mating surface. In some examples, the copper surrounding the mounting hole and/or alignment pin may be electrically isolated or disconnected from the remainder of the copper layer by, for example, etching.

Generally, computing systems and electronic devices such as desktop computers, laptop computers, servers, thin clients, tablets, smartphones, digital video recorders, retail point of sale devices, and other computing equipment (hereinafter "device" or "devices") may comprise a printed circuit board. As discussed above, PCBs may be relatively thin, layered substrates upon which integrated circuits and other electronic components may be mounted to form, for example, a printed circuit assembly (or "PCA", used interchangeably herein with "PCB" solely for purposes of this application).

A PCB may include a plurality of electrically conductive and insulating layers arranged in a sandwich-like fashion. Conductive layers generally have conductive paths or traces, which are chemically or mechanically etched out of the bulk conductive layer, thus isolated from one another by insulating material and routed within a plane. These traces are generally designed to electrically contact conductive portions of the electronic components mounted on the PCB, forming electrical interconnects. Insulating layers may electrically isolate conductive layers from one another.

In some devices, such as devices utilizing a touchscreen, a PCA may also include or be mated or coupled to a touchscreen system such as an infrared touch system. For example, an infrared touch system may include a light source such as infrared light-emitting diodes ("LEDs") and/or photodiodes or other sensors, which may be positioned proximate to a light guide assembly ("light guide").

An optical path may allow light to travel from, for example, the LEDs on a PCB to a light guide, which may direct the light across a touch surface and/or to photodiodes on the opposite side of the PCB. When the surface or screen proximate to a light guide is touched by, for example a fingertip, the light quantity on the photodiodes or other sensors may be decreased, allowing for the detection of an input position on the touch screen system.

In some examples, a light guide may be bolted to a PCB, and more specifically, bolted toward the corners of a PCB such that the mounting hardware used to mate the light guide and PCB is not likely to interfere with the path of light. However, an infrared touch system may require maintaining very tight mechanical tolerances between a PCB, infrared LEDs, photodiodes, and the light guide to maintain the quality of the optical path, which may be particularly sensitive to vertical displacement between the photodiodes and the light guide.

In some examples where a PCB is modified to accommodate a light guide, such as by removing inner layers of copper and/or outer layers of silkscreen from the edges of the PCB, the edges of the PCB may "feather" or thin. In such cases, the areas where the light guide bolts to the PCB, i.e., the surface where mounting feet of the light guide are bolted, may curve, twist, warp, or bow. Bowing of the PCB may displace the diodes vertically from the light guide and reduce the alignment of the optical path, or generally compromise the touch screen system and require increased power to provide an effective optical path.

In such cases, the performance or accuracy of the touch screen system may be impacted or even entirely disrupted. Defects or issues resulting from the touch screen system may result in significant manufacturing yield losses, and may require costly and time-consuming work by a technician in a factory or in the field, which may result in other issues from, for example, product handling, dusty environments, and/or temperature exposure.

According to an example described herein, to prevent or minimize bowing of the PCB and to provide a flat and stable platform for mounting a light guide or other component, a PCB may comprise at least a first: layer and a second layer. The first layer may comprise a first material, e.g., copper, and the second layer may comprise a second material, e.g., fiberglass.

In some examples, the first layer may further comprise at least one mounting hole surrounded by a third material, which may also be copper, at a thickness equal to a thickness of the first layer. The first material may be electrically isolated from the third material, e.g., the third material may form a copper "island" around the mounting hole or be referred to as "floating copper." The PCB may comprise additional layers, e.g., additional layers of fiberglass and/or copper.

FIG. 1 illustrates a printed circuit board, according to an example of the present disclosure. PCB 100 may comprise a plurality of layers, such as conductive layers and/or insulating layers, as discussed below in more detail with respect to FIG. 4.

Generally, conductive layers such as those in PCB 100 may be made of a metal with a high electrical conductivity, such as copper (Cu) or tungsten (W). These metallic conductive layers may be used to provide power and ground planes for components positioned on PCB 100, or may be patterned to form conductive paths, such as traces and pads, which enable signals to flow from one point of PCB 100 to another. Insulating layers may be disposed between conductive layers to surround, for example, traces and pads to prevent contact between each other.

PCB 100 may also comprise components such as a processor, memory, and information storage devices coupled to the PCB 100 to form a PCA, as discussed above. In general, PCB 100 may provide a base for interconnecting semiconductor components, input/output connectors and/or other electronic components.

PCB 100 may also comprise mounting holes, such as mounting holes 102, 104, 108, and 110. Mounting holes 102, 104, 108, and 110 may be used, for example, to mount PCB 100 to a chassis or system, or to another component or device such as a light guide, e.g., light guide 512 discussed below in more detail with respect to FIG. 5.

PCB 100 may also include mounting or alignment pins such as alignment pins 106 and 112. In some examples, alignment pins 106 and 112 may be used to align PCB 100 with a light guide, such as to allow proper placement of the light guide and an optimized light path between, for example, a touchscreen and photodiodes. In an example, the LEDs project light into the light guides, and the light guides transmit light into the photodiodes.

In the example of FIG. 1, a metal layer, e.g., copper, is shown across PCB 100, although as discussed above and illustrated in FIG. 4, PCB 100 may comprise multiple layers of various materials. In FIG. 1, crosshatching from left to right illustrates a copper layer which covers the span of the layer except for the four corners 114, 116, 118, and 120.

In an example, corners 114, 116, 118, and 120 comprise a metal, e.g., copper, surrounding the mounting holes and/or alignment pins, as illustrated by crosshatching from right to left. In the example of FIG. 1, the copper between corners 114, 116, 118, and 120 and the remainder of the copper layer is etched away, thereby creating a copper "island" around the mounting holes and/or alignment pins, and electrically disconnecting or isolating the copper around the mounting holes and/or alignment pins.

The copper placed in corners 114, 116, 118, and 120, which might otherwise be free of material, may prevent or minimize bowing of the PCB by maintaining uniform thickness to the edges or corners of PCB 100. The copper placed in corners 114, 116, 118, and 120 may also provide a flat and stable platform for mounting a light guide or other component.

Figure 2:
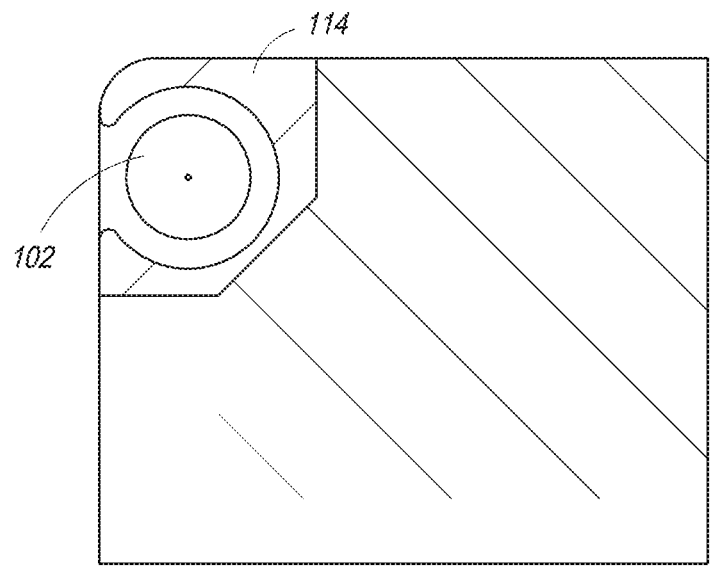
FIG. 2 illustrates a corner of a printed circuit board including a mounting hole, according to an example of the present disclosure.
Figure 3:
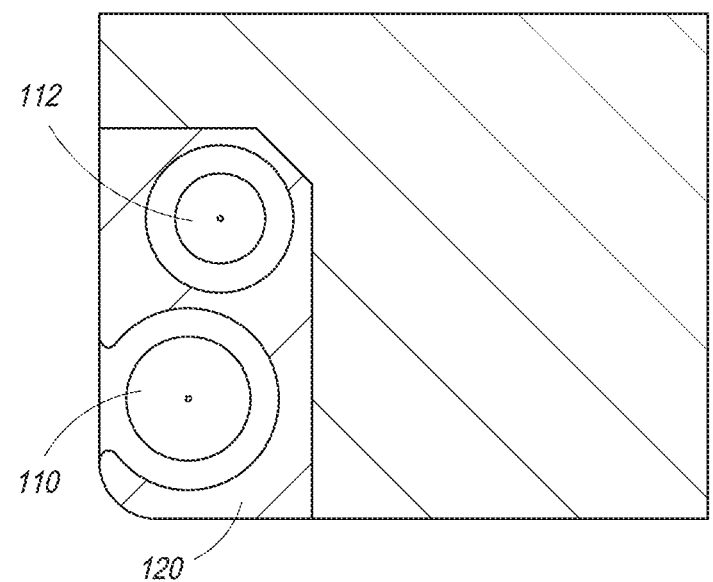
FIG. 3 illustrates a corner of a printed circuit board including a mounting hole and an alignment pin, according to an example of the present disclosure.

FIG. 2 illustrates a close-up view of corner 114 and mounting hole 102 of PCB 100, according to an example of the present disclosure. FIG. 3 illustrates a close-up view of corner 120, mounting hole 110, and alignment pin 112 of PCB 100, according to an example of the present disclosure.

Figure 4:
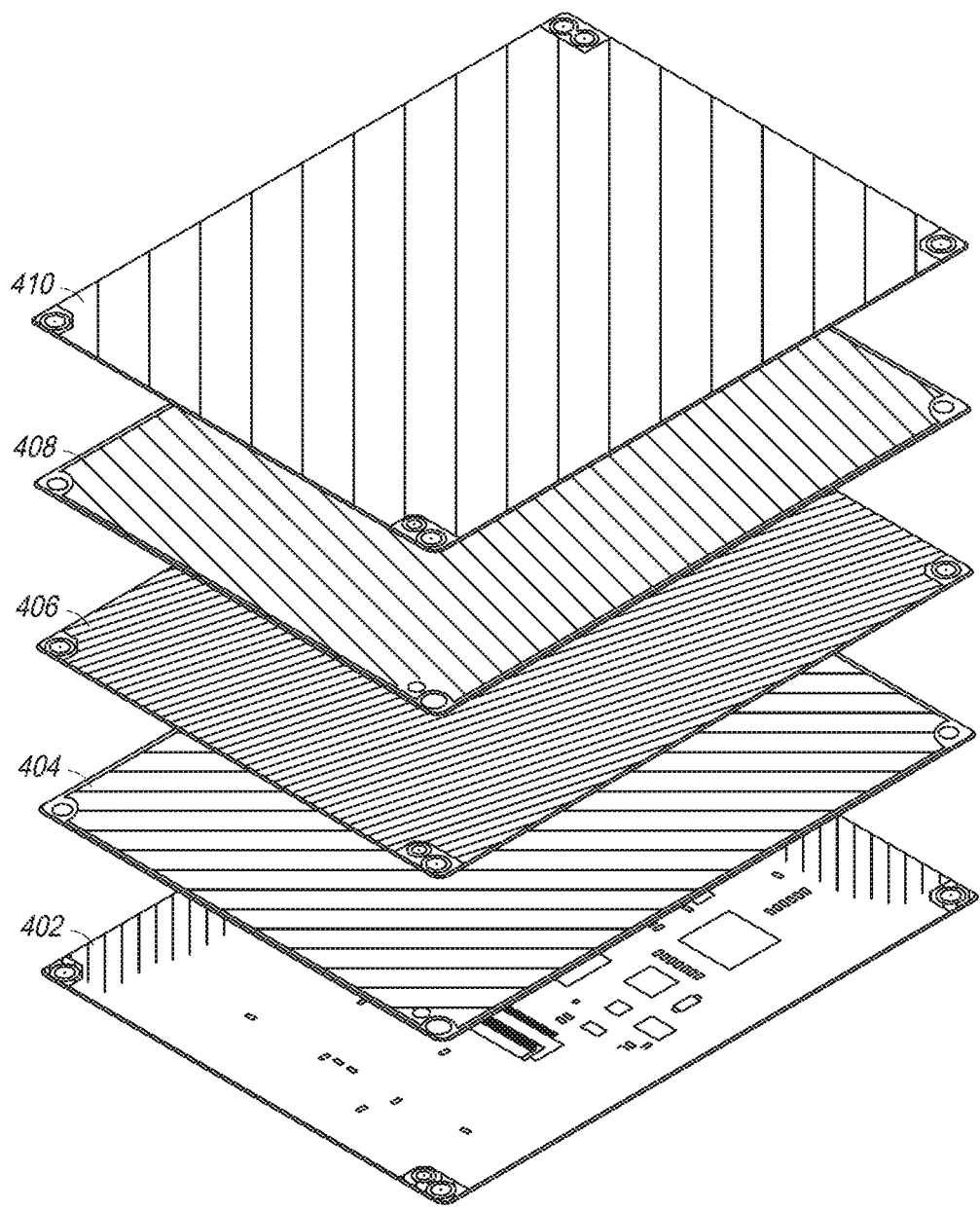
FIG. 4 illustrates an exploded view of a printed circuit board, according to an example of the present disclosure.

FIG. 4 illustrates an exploded view of a printed circuit board, according to an example of the present disclosure. In the example of FIG. 4, a PCB comprises a total of five layers, further comprising copper layers 402, 406, and 410, and fiberglass layers 404 and 408.

In the example of FIG. 4, layers 402, 406, and 410 comprise a material, e.g., copper illustrated by cross hatching, that is electrically disconnected or isolated from a corner material, which may also be copper. The copper in the corners of layers 402, 406, and 410 may be of uniform thickness to the remainder of the layer, as described above.

In contrast to layers 402, 406, and 410, layers 404 and 408 may comprise a material that spans the entire width and length of the layer, inclusive of the corners of the layer. In some examples, layers 404 and 408 may be fiberglass from edge to edge, including around the mounting hole, while in other examples, the material such as fiberglass may not fully surround the mounting hole such that the corner or corners of the PCB are rounded. In some examples, various combinations of layers, materials, and corners may be utilized.

Figure 5:
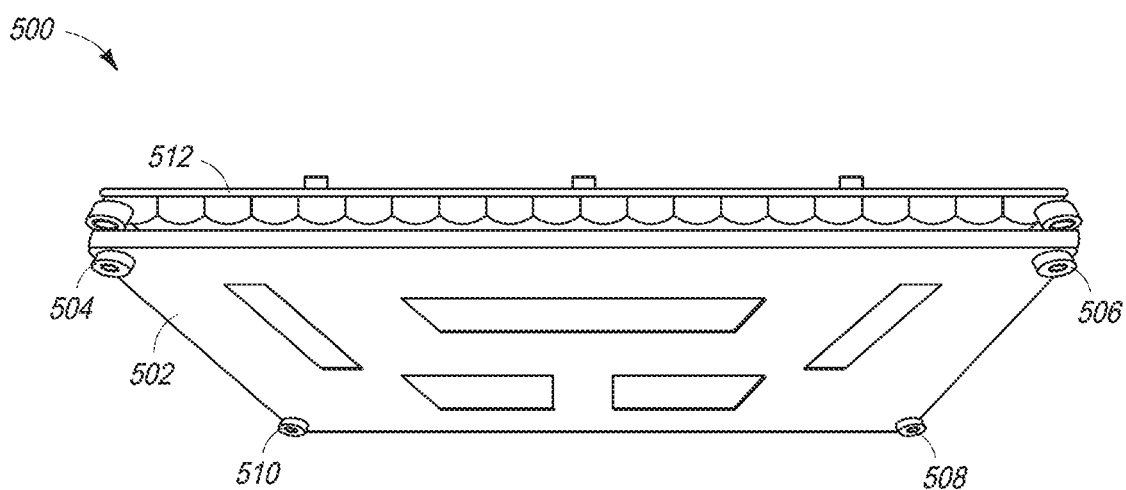
FIG. 5 illustrates a printed circuit board and a light guide, according to an example of the present disclosure.

FIG. 5 illustrates a PCB 502 and a light guide 512, according to an example of the present disclosure. PCB 502 may comprise one or more mounting holes 504, 506, 508, and 510, which may allow PCB 502 to securely mate or couple with light guide 512 using the systems and methods described herein. In some examples, silk screen or solder mask may be removed from PCB 502 near light guide 512 mounting locations. In other examples, components other than a light guide 512 may be mounted to PCB 502 using the systems and methods described herein.

Figure 6:
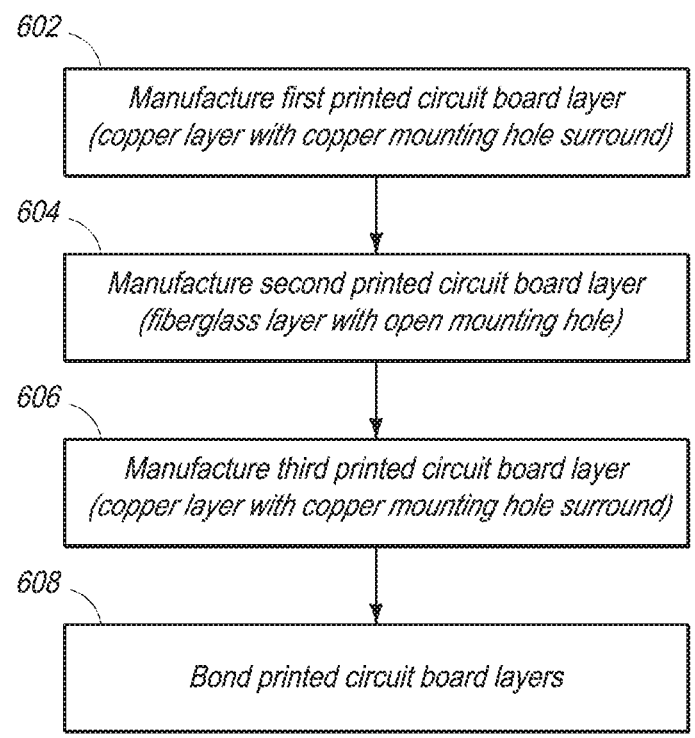
FIG. 6 illustrates a flowchart of manufacturing a printed circuit board, according to an example of the present disclosure.

FIG. 6 illustrates a flowchart of manufacturing a printed circuit board, according to an example of the present disclosure.

In block 602, a first PCB layer is manufactured. In an example, the first layer may be a metal, e.g., a copper layer, with a copper mounting hole surround that is electrically disconnected or isolated from the remainder of the copper layer. As discussed above, the copper mounting hole (and/or alignment pin) may be used to mount or align the PCB to, e.g., a light guide.

In block 604, a second PCB layer is manufactured. In an example, the second layer may be a fiberglass layer, with fiberglass extending toward or around the mounting hole and/or alignment pin used to mount or align the PCB to, e.g., a light guide.

In block 606, similar to the step of block 602, a third PCB layer is manufactured. In an example, the third layer may be a metal, e.g., a copper layer, with a copper mounting hole surround that is electrically disconnected or isolated from the remainder of the copper layer. As discussed above, the copper mounting hole (and/or alignment pin) may be used to mount or align the PCB to, e.g., a light guide.

In block 608, the layers of the printed circuit board are bonded. For example, the layers may be stacked and pressed, and/or subjected to varying temperatures to cure resins, adhesives, or other materials used in the bonding process. In some examples, block 608 may also include drilling, plating, creating a printed circuit pattern, and/or mounting components.

The above discussion is meant to be illustrative of the principles and various embodiments of the present disclosure. Numerous variations and modifications will become apparent once the above disclosure is fully appreciated. It is intended that the following claims be interpreted to embrace all such variations and modifications.

What is claimed is:

1. A device, comprising:
   a printed circuit board including a first layer having a first material and a second layer having a second material, the first material spanning the first layer except at a corner of the first layer; and
   a mounting hole in the first layer disposed at the corner in the first layer and surrounded by a third material, the mounting hole having a thickness equal to a thickness of the first layer and being apart from the first material, the third material electrically isolated from the first material.

2. The device of claim 1, wherein the first material and the third material are copper.

3. The device of claim 1, wherein the second material is fiberglass.

4. The device of claim 1, wherein the printed circuit board is to receive a touchscreen light guide.

5. The device of claim 1, wherein the printed circuit board further comprises a mounting alignment pin proximate to the mounting hole.

6. A device comprising:
   a touchscreen light guide assembly;
   a printed circuit board including a first layer having copper spanning the first layer except at a corner of the first layer; and
   a mounting hole, to receive the touchscreen light guide assembly, proximate to the corner of the printed circuit board, the mounting hole surrounded by additional copper, the mounting hole having a thickness equal to a thickness of the first layer and excluding the first material,
   wherein the additional copper surrounding the mounting hole is electrically disconnected from the copper of the first layer.

7. The device of claim 6, further including a second layer.

8. The device of claim 7, wherein the second layer is a fiberglass layer.

9. The device of claim 7, wherein the first layer and the second layer are bonded.

10. A method comprising:
    manufacturing a first printed circuit board layer of a printed circuit board so that a first material of the first printed circuit board layer spans the first printed circuit board layer except at a corner of the first printed circuit board layer;
    manufacturing a second printed circuit board layer, the second printed circuit board layer including a second material;
    providing a mounting hole at the corner in the first printed circuit board layer and surrounded by a third material, the mounting hole having a thickness equal to a thickness of the first printed circuit board layer and excluding the first material, the third material electrically isolated from the first material;
    bonding the first printed circuit board layer and the second printed circuit board layer to form a printed circuit board.

11. The method of claim 10, further comprising etching between the first material and the third material to electrically isolate the third material from the first material.

12. The method of claim 10, wherein the first material and the third material are copper.

13. The method of claim 10, wherein the second material is fiberglass.

* * * * *